United States Patent
Yamamoto et al.

[11] Patent Number: 5,865,934
[45] Date of Patent: Feb. 2, 1999

[54] METHOD OF MANUFACTURING PRINTED WIRING BOARDS

[75] Inventors: Yuichi Yamamoto; Yoshizumi Sato; Tomohisa Motomura; Hiroshi Hamano, all of Tokyo; Yasushi Arai, Fujisawa, all of Japan

[73] Assignee: Kabushiki Kaisha Toshiba, Kawasaki, Japan

[21] Appl. No.: 902,100

[22] Filed: Jul. 29, 1997

Related U.S. Application Data

[62] Division of Ser. No. 297,954, Aug. 31, 1994, Pat. No. 5,736,681.

[30] Foreign Application Priority Data

| Sep. 3, 1993 | [JP] | Japan | 5-219751 |
| Sep. 9, 1993 | [JP] | Japan | 5-224785 |
| Sep. 10, 1993 | [JP] | Japan | 5-226106 |

[51] Int. Cl.$^6$ ................................. H05K 3/10
[52] U.S. Cl. ............... 156/295; 156/298; 156/303.1; 29/844; 29/884
[58] Field of Search ............... 156/295, 298, 156/330, 303.1; 29/846, 844, 874, 884, 882; 228/179.1

[56] References Cited

U.S. PATENT DOCUMENTS

| 3,079,672 | 3/1963 | Bain, Jr. et al. | 29/850 |
| 3,488,429 | 1/1970 | Boucher | 174/264 |
| 3,764,436 | 10/1973 | Schmidt et al. | 156/288 |
| 3,835,531 | 9/1974 | Luttmer | 29/843 |
| 3,881,799 | 5/1975 | Elliott et al. | 439/816 |
| 4,383,363 | 5/1983 | Hayakawa et al. | 29/847 |
| 4,763,403 | 8/1988 | Klein et al. | 29/598 |
| 4,893,404 | 1/1990 | Shirahata et al. | 29/852 |
| 4,967,314 | 10/1990 | Higgins, III | 361/792 |
| 5,219,639 | 6/1993 | Sugawara et al. | 428/209 |
| 5,245,135 | 9/1993 | Schreiber et al. | 174/261 |
| 5,431,571 | 7/1995 | Hanrahan et al. | 439/91 |
| 5,457,881 | 10/1995 | Schmidt et al. | 29/852 |
| 5,474,629 | 12/1995 | Yamazaki et al. | 156/99 |
| 5,527,998 | 6/1996 | Anderson et al. | 174/255 |
| 5,601,678 | 2/1997 | Gerber et al. | 156/150 |

FOREIGN PATENT DOCUMENTS 0 620 701 10/1994 European Pat. Off. .
G 91 02 817.5 10/1991 Germany .

*Primary Examiner*—Francis J. Lorin
*Attorney, Agent, or Firm*—Finnegan, Henderson, Farabow, Garrett & Dunner, L.L.P.

[57] ABSTRACT

There is provided a method for arranging conductive bumps at predetermined positions penetrated through an insulating layer during a press integration stage to ensure electrical and thermal conductivities between a wiring pattern and a conductive metal as well as electrical connections between the wiring patterns. More specifically, the sharp tip of the conductive bump is subjected to plastic deformation to form the interconnections between the wiring patterns or between the wiring pattern and the conductive metal. Also provided is a method of manufacturing a printed wiring board. A synthetic resin sheet is sandwiched by the surface on which conductive bumps are formed into a laminate. The laminate is heated until the resin component of the synthetic resin sheet being is in a plastic state or up to a temperature not lower than the grass transition temperature of that resin. At that time, the conductive bumps are forced against the synthetic resin sheet and are penetrated therethrough. This permits positive connections with a high accuracy without forming a through-hole.

26 Claims, 9 Drawing Sheets

METHOD OF MANUFACTURING PRINTED WIRING BOARDS

This is a division of application Ser. No. 08/297,954, filed Aug. 31, 1994 now U.S. Pat. No. 5,736,681.

BACKGROUND OF THE INVENTION

1. Field of the Invention

The present invention relates to a printed wiring board on which high-density wiring or electronic components can be mounted. In addition, the present invention relates to a method of manufacturing a printed wiring board with a high yield while reducing the number of processes.

2. Description of the Related Art

Double-sided and multilayer printed wiring boards comprise various wiring patterns. For example, each face of the double-sided printed wiring board comprises wiring patterns such as double-sided conductive patterns. Likewise, wiring patterns are formed layer by layer of the multilayer printed wiring boards. The wiring patterns of one face or layer are electrically connected to those of the other(s). In this event, the connections between the wiring patterns can be achieved in a following manner.

For the double-sided printed wiring board, a base plate is first laminated with a copper foil on both sides thereof. A number of through-holes are formed through the base plate at predetermined positions thereon. Subsequently, an entire surface, including the inside of the through-holes, is plated by a chemical plating process. A conductor layer is then deposited on the inner walls of the through-holes by an electroplating process to increase a thickness of the conductor (metal) layer. This electrically connects the wiring patterns of one face to those of the other face with a higher reliability.

On the other hand, for the multilayer printed wiring board, a double-sided wiring board is formed by means of patterning copper foils laminated on both sides of a base plate. Copper foils are positioned and disposed on the patterned surfaces through an insulating sheet (e.g., prepreg sheets). The resultant structure is then integrally bonded under heat and pressure. Subsequently, as in the case of the above mentioned double-sided printed wiring board, through-holes are formed and the wiring patterns of the individual layers are electrically connected to each other by a plating process. Further, the copper foils positioned and disposed on the patterned surfaces are patterned to obtain a multilayer wiring board. A multilayer printed wiring board having many patterned layers may be manufactured through a method with an increased number of interposed double-sided printed wiring boards.

Alternatively, printed wiring boards may be manufactured according to a method in which the wiring patterns are connected without using a plating process. In this method, a number of through-holes are formed through the base plate at predetermined positions thereon. A conductive paste having a resin component is embedded in the through-holes, for example, by a printing technique. The resin component of the conductive paste is then solidified or cured in the through-hole to connect the wiring patterns electrically.

For the above mentioned printed wiring board and the method of manufacturing it by using a plating process for the electrical connections between the wiring patterns, the manufacturing process requires steps of forming the through-holes and of plating the inside of the through-holes for the electrical connections. This disadvantageously makes the manufacturing process for the printed wiring board become excessive, resulting in the necessity for complicated process control. The step of forming the through-holes is required even for the case where the electrical connection is achieved by means of embedding the conductive paste in the through-holes, as in the case where it is achieved by the plating. It is difficult to embed the conductive paste uniformly in the through-holes, and there is some question about long-term reliability of the electrical connections. In any case, the need for forming the through-holes to connect the wiring patterns electrically affects cost and yield for the resulting printed wiring board, which may oppose a current cost-saving demand. Further, the through-holes are opened on both sides of the printed wiring board. No wiring pattern can be formed on the opened through-holes. Likewise, no through-hole can mount electronic components thereon. Accordingly, the through-holes limit the possible improvement of a wiring density as well as of a packaging density for the electronic components on the printed wiring board.

The printed wiring board may be imparted with a heat sinking property to stabilize operation of a circuit device formed on the printed wiring board. The printed wiring board may also be imparted with grounding and shielding properties to avoid damage of a circuit and to suppress radio frequency noise, respectively. For this purpose, the printed wiring board comprises a thin metal plate as a base plate (hereinafter, referred to as a metal-base type printed wiring board). Alternatively, the printed wiring board comprises a thin metal plate as a core (hereinafter, referred to as a metal-core type printed wiring board). The thin metal plate serves as a support, a reinforcement and a heat sinking element as well as a ground electrode.

The printed wiring boards of the metal-base and metal-core types still have some disadvantages. As in the above mentioned case, the through-holes are required to be formed by means of drilling a plate for lamination or a laminated plate. The plating layer is deposited on the inside of the through-holes and a conductive metal or a conductive composition is embedded therein. The electrical and thermal conductivities of the printed wiring board are thus provided by the conductive metal or composition as well as the plating layer. Such printed wiring boards can only be manufactured through complicated steps. For the printed wiring board with the interconnections between the wiring patterns achieved by the through-holes, the area available for wiring and packaging on the surface is reduced due to these through-holes. There is thus a limit to the degree of densification of the high-density package circuit with the printed wiring board of the type described.

Some printed wiring boards also have sealing properties. For this purpose, a copper paste or the like is applied to a substrate. The wiring patterns are arranged on a substrate and the copper paste or the like is applied to an area of the wiring patterns through an insulating layer to form a desired shielding layer. The shielding layer is connected to a ground electrode (ground layer) on the substrate and covered with another insulating layer.

The printed wiring board of the type described has problems of insufficient shielding effects and stabilities. Probable reasons for such problems are as follows: the copper paste typically has a high conductor resistance and it is difficult to control the thickness of the coated layer uniformly. In addition, the area to which the shielding properties are imparted projects to a higher position than the remaining portions, so that packaging conditions for a packaging machine should be controlled and modified depending on demand during a subsequent process of forming a package circuit device.

The conventional printed wiring boards are insufficient for complying with the demands on minimizing the circuit devices by the high-density wiring and packaging. There have been strong demands on more effective, cost-saving, and practical printed wiring boards and a method of manufacturing the same.

Accordingly, an object of the present invention is to provide a printed wiring board having high reliability having a simple structure.

Another object of the present invention is to provide a printed wiring board having a simple structure, on which high-density wiring and electronic components can be mounted.

It is another object of the present invention to provide a printed wiring board capable of being manufactured through a simple process, on which high-density wiring and electronic components can be mounted.

It is yet another object of the present invention to provide a method of manufacturing printed wiring boards on which high-density wiring and electronic components can be mounted.

It is still another object of the present invention to provide a method of manufacturing printed wiring boards of high reliability.

Yet another object of the present invention is to provide a method of manufacturing printed wiring boards of high quality with a high yield.

SUMMARY OF THE INVENTION

A first printed wiring board of the present invention, comprises an insulating resin sheet; an interconnection which is press-fitted and embedded in the insulating resin sheet in a thick direction thereof, the interconnection being formed of conductive bumps of which tips are plastically deformed; and a printed wiring pattern formed on the insulating resin sheet and connected to the conductive bumps of the interconnection.

A second printed wiring board of the present invention comprises a thin conductive metal plate; a printed wiring pattern formed on an insulating layer formed on the thin conductive metal plate and an interconnection to connect the printed wiring pattern with the thin conductive metal plate, the interconnection penetrated through the insulating layer; the interconnection being formed on at least one of the thin conductive metal plate and the printed wiring pattern, the interconnection penetrated through the insulating layer in a press integration process and plastically deformed towards the opposing thin conductive metal plate or printed wiring pattern.

A first method of manufacturing a printed wiring board according to the present invention comprises the steps of forming conductive bumps on supports at predetermined positions thereof; interposing a synthetic resin sheet between the surfaces of the supports on which the conductive bumps are formed; laminating the supports and the synthetic resin sheet as a laminate; heating the laminate; and pressing the laminate at a glass transition temperature through a plasticizing temperature or a curing temperature of the resin component of the synthetic resin sheet to make the conductive bumps be inserted into the synthetic resin sheet in a direction of a sheet thickness, thereby connecting the tips of the corresponding conductive bumps with each other by using plastic deformation to form interconnections of a through-type.

A second method of manufacturing a printed wiring board according to the present invention comprises the steps of forming conductive bumps on supports at least at a part of predetermined positions, the supports being provided with a conductor layer as a base layer; interposing a synthetic resin sheet between the surfaces of the supports on which the conductive bumps are formed; laminating the supports and the synthetic resin sheet as a laminate; heating the laminate; and pressing the laminate at a glass transition temperature through a plasticizing temperature or a curing temperature of the resin component of the synthetic resin sheet to make the conductive bumps be inserted into the synthetic resin sheet in a direction of a sheet thickness, thereby connecting the tips of the corresponding conductive bumps with each other by using plastic deformation to form interconnections of a through-type.

A third method of manufacturing a printed wiring board according to the present invention comprises the steps of forming conductive bumps on a principal surface of a conductive metal layer at predetermined positions thereof; facing a principal surface of a synthetic resin sheet to the principal surface of the conductive metal layer to form a laminate comprising a number of layers including an inner layer wiring pattern; heating the laminate; pressing the laminate at a glass transition temperature through a plasticizing temperature or a curing temperature of the resin component of the synthetic resin sheet to make the conductive bumps be inserted into the synthetic resin sheet in a direction of a sheet thickness, thereby connecting the conductive bumps with the inner wiring pattern on the synthetic resin sheet to form a multilayer wiring board; forming a through-hole for use in receiving a lead pin penetrated through the multilayer wiring board at a predetermined position; and disposing a metal layer on the inner surface of the through-hole by using a plating process. In this method, a part of the conductive bumps may be formed at a selected position such that a portion of the conductive bump is exposed to the inner wall of the through-hole when the through-hole is formed.

In the present invention, the support on which conductive bumps are formed may be a sheet of a synthetic resin or a conductive sheet (e.g., a copper foil) having good release characteristics. The support may be a single sheet or patterned, of which configuration is not limited. The term "conductive bumps" used in the present invention means those having any shapes, including generally conical conductive bumps unless otherwise distinguished from them. While "transferred" from the support to the sheet of the synthetic resin, the conductive bumps may be embedded in the synthetic resin by pressure.

The conductive bumps are preferably made of a material having such hardness that permits penetration of the bumps through the synthetic resin sheet in a primary pressing stage where the resin component of the synthetic resin sheet is in a plasticized state or at a temperature not lower than a glass transition temperature thereof, and permits plastic deformation of a tip of each bump in a secondary pressing stage. Examples of a material suitable for this purpose include conductive metals and conductive compositions prepared by mixing conductive powder such as silver, gold, copper, or solder powder, alloy powder thereof, or composite (mixed) metal powder with a single or composite resin of a binder component such as a polycarbonate resin, a polysulfone resin, a polyester resin, a melamine resin, a phenoxy resin, a phenol resin, or a polyimide resin.

The above mentioned conductive bumps have a high aspect ratio when formed with a conductive composition through a printing technique using relatively thick metal masks. Typically, a preferable height of each conductive bump is about 50–500 $\mu$m. The conductive bump may have such a height that permits penetration thereof through the synthetic resin sheet of a single layer. Alternatively, the conductive bump may have a height permitting penetration thereof through the synthetic resin sheet of two or more layers. A combination of these heights may also be used. If the conductive bump is formed into a generally conical shape, a height thereof is typically in a range from 20 to 500 $\mu$m. This height is enough for the bump to "plow" through fibers of a reinforcement when the bump is forced under pressure through the synthetic resin sheet reinforced with the reinforcement such as glass cloth or a mat thereof, organic synthetic fiber cloth or a mat thereof, or paper. As a result of the pressure application, the tip of the generally conical conductive bump can readily be exposed to the other principal surface of the synthetic resin sheet. In this event, only the minimum amount of fibers is broken by the bump because the bump plows therethrough. This significantly contributes to avoiding or suppressing migrations which otherwise may be caused. Accordingly, the quality of the printed wiring board is improved when the conical conductive bumps serve as, for example, conductive interconnections between the wiring patterns. There is another advantage of forming the conductive bump into the generally conical shape. The sharp tip of the conductive bump projects from the other principal surface of the synthetic resin sheet. When a conductive film surface on which terminals of electronic components or patterned layers are formed is pressed against the tip, a high pressure is applied to the tip to cause it to be plastically deformed. An inner, fresh active metal of each generally conical conductive bump is bared and exposed to the conductive film surface as a result of the plastic deformation of the conductive bump. In addition, a fresh, active metal surface is also generated on the pressed conductive film surface. As a result, two active surfaces without impurities are bonded with the robust bonding between metals. More specifically, plastic deformation of the generally conical conductive bump destroys a thin (several micrometers or thinner) oxide layer on the metal surface to which the tip is pressed. As a result, a fresh surface is readily exposed and many other advantages can be obtained. This is particularly true when a surface of the copper foil is chromated to provide anti-corrosive properties and the chromated surface is treated with epoxy silane or amino silane to improve bonding (adhesion) properties to the insulating layer. The pre-treated copper foil exhibits good adhesion and etching properties at a wiring area while ensuring desired electrical connections at a position corresponding to the conductive interconnection. Accordingly, it becomes possible to avoid oxidation of the copper foil during processing. Besides, it is also possible to avoid reduction of peel strength and occurrence of migrations, which is particularly advantageous in a case where the wiring density is directed to improvement involving reduction of a wiring pattern width.

The conductive bumps may also be made of a conductive metal. In this event, a ball of gold or copper may be pressed with, for example, a wire bonder against the support at a predetermined position on the surface of the support laminated with, for example, a copper foil. When the ball of gold or copper is pulled backward, a conductive bump having a sharp end is formed. Alternatively, the conductive bumps may be formed by means pouring a molten metal into grooves formed in a plate or the like which have the same shape as the conductive bump. Another way of forming the conductive bumps uses a photosensitive resist coated thickly over a supporting film on the support. The support is then exposed to light from the side of the supporting film to form a set of dips. Each dip has a shape of a cone or a pyramid. Subsequently, the supporting film is removed from the support and a metal film is laminated on the surface from which the supporting film has removed. The metal film is then plated with copper, gold, silver, or solder to form fine conductive bumps at predetermined positions. In addition, the conductive bumps may be printed by using a squeeze with metal masks or the like.

Other methods of forming the conductive bumps include: (a) applying previously an adhesion layer to the support and scattering or distributing fine metal lumps having generally uniform shape or dimension over the adhesion-applied surface, which the fine metal lumps are then selectively adhered (in this event, adhesion may be achieved by using a mask.); (b) coating the support with a plating resist and patterning it, over which copper, lead, gold, silver, or solder is plated to form selectively fine metal projections (bumps) if the support used is a copper foil or the like; and (c) applying and patterning a solder resist on the support, which is then dipped into a solder bath to form selectively fine metal projections (bumps). It is noted that the fine metal lumps or projections corresponding to the conductive bumps may have a multilayer structure or a core-shell structure formed by a combination of divergent metals. For example, a core of copper may be covered with gold or silver to provide antioxidation properties. Alternatively, the copper core may be covered with solder to provide solder bonding properties. In the present invention, to form the conductive bumps with a conductive composition is more favorable by the economic considerations than a case using the plating technique because the former method permits simplification of the manufacturing process.

The conductive bumps are press-fitted in or penetrated through the synthetic resin sheet to form conductors or conductive interconnections of a through-type. The synthetic resin sheet may be a film (sheet) of a thermoplastic resin. A film thickness is preferably in a range from 50 to 800 $\mu$m. Examples of the thermoplastic resin include polyvinyl chloride resins, polyester resins, polyether-imide resins, polypropylene resins, polyphenylene sulfide resins, polycarbonate resins, polysulfone resins, thermoplastic polyimide resins, tetrafluoroethylene resins, hexafluoropolypropylene resins, and polyetheretherketone resins. Alternatively, the synthetic resin sheet may be made of a thermosetting resin capable of being kept in a precured (uncured) state. Examples of the thermosetting resin of the type described include epoxy resins, bismaleimide triazine resins, polyimide resins, phenolic resins, polyester resins, melamine resins, and polyphenyloxide resins as well as raw rubbers such as butadiene rubbers, butyl rubbers, natural rubbers, neoprene rubbers, and silicone rubbers. These synthetic resins may be used alone and may contain inorganic insulating fillers or organic fillers. In addition, the synthetic resin sheet may be a combined sheet of a synthetic resin and a reinforcement such as glass cloth or a mat thereof, organic synthetic fiber cloth or a mat thereof, or paper.

In the present invention, the principal surface of the synthetic resin sheet is faced to the principal surface of the support on which the conductive bumps are formed. The synthetic resin sheet is thus laminated on the support as a laminate. The laminate is mounted on a base (caul) and pressed (primary press) thereon. The caul is preferably a metal plate or heat-resistant resin plate of which dimension is less or not changed, i.e., deformation is hardly caused. Examples of the material for the caul include stainless steel, brass, polyimide resins (sheet), and polytetrafluoroethylene resins (sheet). The laminate may be heated until the resin component of the synthetic resin sheet becomes soft. At that time the laminate is pressed to press-fit or penetrate the conductive bumps thereto or therethrough, which results in favorable press-fitting or penetration of the conductive bumps.

A pressed member on the side of the synthetic resin sheet is preferably made of a material that is deformed elastically during the primary press. This is because it has been revealed experimentally that the tip of each conductive bump can be press-fitted to or penetrated through the heated synthetic resin sheet positively when the laminate is received by the pressed member made of a material deformed elastically during the primary press. It has also been revealed in an experimental level that the tip of the conductive bump can be press-fitted or penetrated more positively with an interposition of a thin breakable film having a small elongation coefficient such as an aluminum foil between the pressed member and the synthetic resin sheet. Considerations and problems of the pressed member are similar to a case where the desired conductive bumps are arranged directly on the principal surface of the synthetic resin sheet and are pressed against the latter to form the desired conductive interconnections.

In the primary press, the support with the conductive bumps and the synthetic resin sheet may be unwound from a roll or the like and passed between two rollers in a pressurized state. One roller is preferably made of a metal, heat-resistant hard resin, or ceramic of which dimension is less or not changed and which can be heated with less or no deformation of the roller. The other roller is preferably deformed elastically in response to application of pressure and made of, for example, a rubber, cloth, or polytetrafluoroethylene.

The secondary press is for connecting electrically the tips of the conductive bumps fitted to the synthetic resin sheet with each other, or connecting the tips of the conductive bumps with the conductive metal foil positioned and laminated on the surface from which the conductive bumps are projected. This secondary press is based on the plastic deformation and thus heating is not always required. However, as in the case of the above mentioned primary press, heat may be applied. In any cases, the conductive metal foil or the like is readily bonded to and integrated with the synthetic resin sheet as a result of a melt bonding or curing of the resin(s). To ensure electrical connections between the tips of the conductive bumps, or between the tips of the conductive bumps and the conductive metal foil positioned and laminated on the surface from which the conductive bumps are projected, pressing members for both sides are made of a material of which dimension is less or not changed such as a metal, heat-resistant hard resin, or ceramic. While a plane press technique is preferably used for the secondary press, the rollers may also be used as in the primary press.

As mentioned above, the conductive bumps of the present invention, which are to be press-fitted to or penetrated through the insulating synthetic resin sheet in a direction of thickness to form the conductive interconnections, have the generally conical shape. This sharp end or tip permits easy and positive formation of fine, through-type conductive interconnections at predetermined positions with a high accuracy. In addition, the tips significantly contribute to improvement of the reliability of the electrical connections between the wiring patterns on both sides of the support. Further, it serves as a highly reliable printed wiring while contributing to reduction in size and improvement in functions at the electrical connections through the insulating synthetic resin sheet.

In the method of manufacturing printed wiring boards according to the present invention, the conductive interconnections are provided in a following manner for electrically connecting the wiring patterns of the layers with each other. By the primary press for laminate formation, the tip of each conductive bump is positively press-fitted to or penetrated through the synthetic resin sheet at a predetermined position with a high accuracy which the synthetic resin sheet serves as the interposed insulating layer. In this event, the resin component is in a plastic state or is heated to a temperature not lower than the glass transition temperature of that resin. In the second press, the synthetic resin sheet is plasticized. In addition, the tips of the conductive bumps are abutted to each other. Otherwise, the tips of the conductive bumps are subjected to plastic deformation as a result of being abutted to the conductive metal foil surface. This provides positive lamination and electrical connections between the wiring patterns of the layers with a high reliability. In other words, it is possible to form highly reliable electrical connections between fine wiring patterns at any positions with a high accuracy while simplifying the manufacturing process itself. Accordingly, a printed wiring board with a high wiring density can be manufactured at low costs. In addition, it is unnecessary to form through-holes for electrical connections between the wiring patterns. The resultant printed wiring board thus becomes suitable for the wiring and packaging of high densities.

BRIEF DESCRIPTION OF THE DRAWING

These and other objects, features and advantages of the present invention will become more apparent in light of the following detailed description of the preferred embodiments as illustrated in the accompanying drawings in which.

DESCRIPTION OF THE PREFERRED EMBODIMENTS

Figure 1:
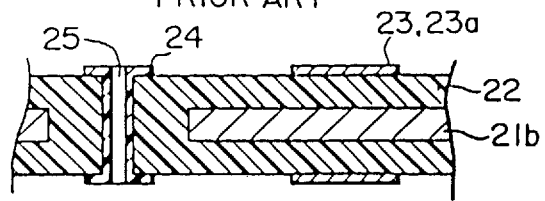
FIG. 1 is a sectional view showing essentials of still another conventional printed wiring board.

Conventional printed wiring boards are described first for facilitating understanding of the present invention. Like reference numerals indicate like components and parts throughout the following detailed description.

Figure 2A:
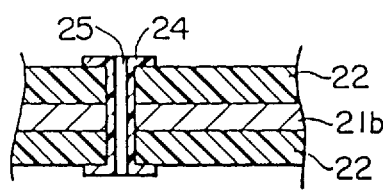
FIGS. 2A and 2B are sectional views showing essentials of other conventional printed wiring boards.
Figure 2B:
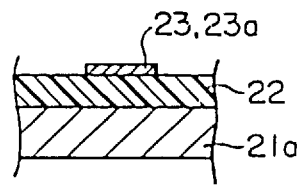

Referring to FIGS. 1, 2A and 2B, a conventional wiring board comprises a metal support. The printed wiring boards in FIGS. 1 and 2A are the metal-base type while the printed wiring board in FIG. 2B is the metal-core type. The metal plates of the metal-core and metal-base type printed wiring boards are referred to as a base metal support 21a and a core metal plate 21b, respectively. These two types of metal plates are also generally referred to as a metal plate 21 for a simple description. An insulating layer 22 is formed on the metal plate 21, on which a conductive (wiring) pattern 23 is arranged. In addition, the insulating layer 22 carries a contact pad 23a arranged thereon. It is understood that a number of wiring patterns 23 and contact pads 23a are arranged on the insulating layer 22 though only a few of them are illustrated in these figures. An interconnection 24 is for connecting the wiring patterns 23 with each other. The interconnection 24 also connects the contact pad 23a with the base metal support 21a or with the core metal plate 21b. Further, a through-hole 25 is formed through the metal plate 21 and the insulating layers 22. As mentioned above, the metal plate 21 serves as a support, a reinforcement and a heat sinking element as well as a ground electrode. As apparent from these figures, it is necessary to form the through-holes 25 of which inside is plated layer for the electrical connections. It is troublesome to form many through-holes and is difficult to embed the conductive paste uniformly therein. The need for the through-holes affects cost and yields for the resulting printed wiring board because the through-holes are required to be drilled. Further, the opened through-holes limit the area available for wiring and packaging on the surface.

Figure 3:
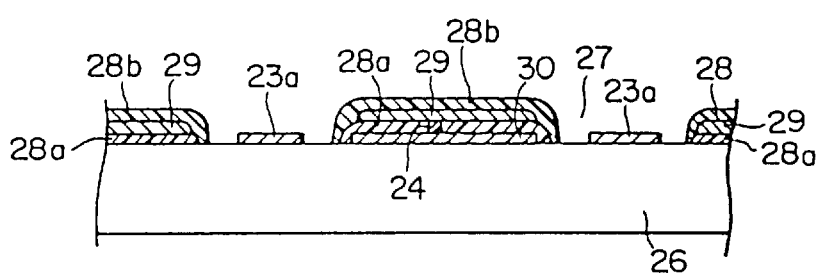
FIG. 3 is a sectional view showing essentials of yet another conventional printed wiring board.

Some printed wiring boards also have sealing properties as mentioned above. To impart such sealing properties to the printed wiring board, a copper paste for example is applied to a substrate. The printed wiring board of this type is illustrated in FIG. 3, in which a wiring pattern 27 is arranged on a substrate 26. The copper paste or the like is applied to an area of the wiring pattern 27 through an insulating layer 28a to form a desired shielding layer 29. The shielding layer 29 is connected to a ground electrode (ground layer) 30 on the substrate 26 through the interconnection 24. In addition, the shielding layer 29 is covered with another insulating layer 28b. As mentioned above, the printed wiring board of the type described has problems of insufficient shielding effects and stabilities mainly due to the high conductor resistance of the copper paste difficulties in controlling the thickness of the coated layer uniformly.

The conventional printed wiring boards are thus insufficient for complying with the demands on minimizing the circuit devices by the high-density wiring and packaging as described in the preamble of the instant specification.

Preferred embodiments of the present invention are now described with reference to the drawing.

First Embodiment

Figure 4:
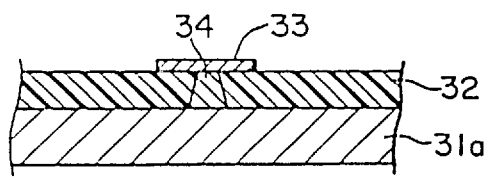
FIG. 4 is a sectional view showing essentials of a printed wiring board according to a first embodiment of the present invention.

Referring to FIG. 4, the printed wiring board according to this embodiment comprises a thin conductive metal plate 31a which serves as a metal base plate. An insulating layer 32 is laminated on one surface of the thin conductive metal plate 31a. A wiring pattern 33 is formed on the insulating layer 32. The wiring pattern 33 and the thin conductive metal plate 31a are connected with each other by an interconnection 34. As shown in the figure, the interconnection 34 is penetrated through the insulating layer 32. One feature of the present invention is the interconnection 34 for the printed wiring board formed in a following manner. The interconnection 34 is formed of a conductive bump that is provided previously on at least one of the thin conductive metal plate 31a and the wiring pattern 33. More specifically, the thin conductive metal plate 31a, the insulating layer 32, and the wiring pattern 33 are adequately laminated and pressed to form a laminate. During this pressing operation, the conductive bump is penetrated through the insulating layer 32 and plastically deformed against the opposing thin conductive metal plate 31a or the wiring pattern 33. As a result, the thin conductive metal plate 31a and the wiring pattern 33 are connected electrically while ensuring mechanical connections therebetween to render themselves as the integrated laminate.

Figure 5:
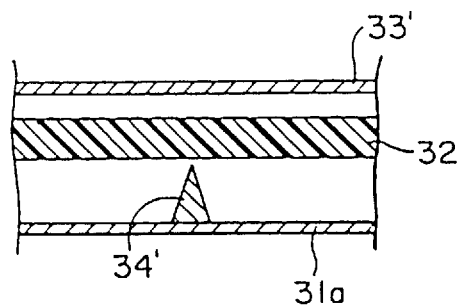
FIG. 5 is a sectional view for use in describing a process for manufacturing a printed wiring board according to the present invention.

Next, a method of manufacturing such printed wiring board is described with reference to FIG. 5. The thin conductive metal plate 31a used was an aluminum plate. The insulating layer 32 used was an insulating resin film having thermoplastic properties such as a polyetherimide film of, for example, 50 μm thick (trade name SUMILITE FS-1400, manufactured by Sumitomo Bakelite Co., Ltd.). In addition, an electrolytic copper foil 33' was used as a conductive layer for use in forming a wiring pattern. A conductive bump 34' was adhered to and formed on a principal surface of the aluminum plate 31a at a predetermined position. The conductive bump 34' was based on a silver paste and had a conical (or pyramid) shape of a little less than 200 μm height. In this event, the conductive bump 34' was adhered and formed in a following manner. A silver-based conductive paste of, for example, a polymer type (trade name Thermosetting Conductive Paste DW-250 H-5, manufactured by Toyobo Company Limited) was printed on the aluminum plate 31a and dried thereon by using a metal mask. This print-dry cycle was repeated three times. The metal mask used had a number of holes each having a diameter of 0.4 mm that are formed in a stainless steel plate of 200 μm thick into a lattice of 2.54 mm pitch. Thereafter, the aluminum plate 31a on which the conductive bump 34' was formed, the polyetherimide resin film 32 and the electrolytic copper foil 33' were laminated into a laminate. Subsequently, this laminate was loaded on a heat press which had been set to a desired temperature (e.g., 250° C.) and was pressed after the polyetherimide resin film 32 was plasticized to penetrate the conductive bump 34' on the aluminum plate 31a through the polyetherimide resin film 32 in a direction of thickness (direction perpendicular to the film surface). In addition, the tip of the conductive bump 34' was plastically deformed to form a metal base plate with the copper foil that had the interconnection 34 to the electrolytic copper foil 33'. Next, the copper foil 33' of the metal base plate was subjected to a common photo-etching to provide the desired wiring pattern 33. In this way, the printed wiring board having the interconnection 34 as shown in FIG. 4 can be obtained.

To confirm the reliability of the connection between the wiring pattern 33 and the base plate 31a, a hot oil test of 500 cycles (one cycle: 15 seconds in oil of 260° C. and 15 seconds at 25° C.) revealed that no connection failure was found and the reliability of the connection was superior to the one obtained according to a conventional copper plating process.

As an alternative method, a conductive bump (projected conductor) was formed with a conductive paste on a polyimide resin film (trade name Kapton Film, manufactured by Du Pont-Toray Co., Ltd.) at a desired area by using screen printing. The polyimide resin film served as a supporting sheet having a good release property and was, for example, 50 μm thick. An insulating resin film (sheet) and a caul were overlapped with the polyimide resin film on which the conductive bump was formed, which was held between hot plates of the heat press and pressed after the insulating resin film was plasticized. The tip of the conductive bump penetrating through the insulating resin film is made flat when plastically deformed. against the surface of the caul. Thereafter, the supporting sheet was removed to manufacture the plate having the interconnections arranged at predetermined positions. For this plate, each interconnection was tested from both of the front and back sides by using a tester. As a result, a resistance was 0.1Ω or smaller for all interconnections. It was also possible to produce a desired printed wiring board by means of forming necessary wiring patterns on the plate through a method of, for example, a common screen printing.

Figure 6:
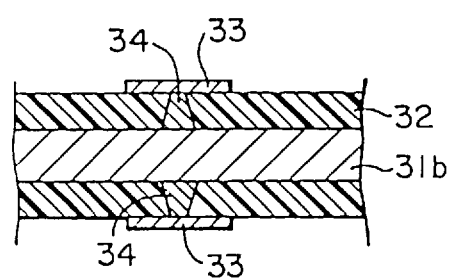
FIG. 6 is a sectional view showing essentials of another printed wiring board according to the present invention.
Figure 7:
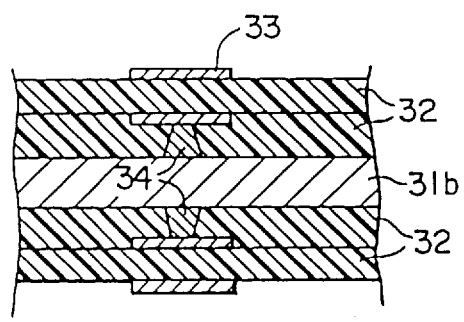
FIG. 7 is a sectional view showing essentials of yet another printed wiring board according to the present invention.

FIGS. 6 and 7 are views showing essentials of a metal-core type printed wiring board according to the present invention. Wiring patterns 33 are arranged at both sides of a metal core 31b through the insulating layers 32. With this structure, the metal core 31b is electrically and thermally connected to the wiring patterns 33 through the interconnections 34 formed of the conductive bumps 34'.

As described above, it is unnecessary to form a through-hole for the interconnections 34 in all cases illustrated in FIGS. 4, 6 and 7. In addition, there is no reduction of the wiring area and the packaging area involved in the through-hole formation. Accordingly, the wiring density and the packaging density can be improved more readily.

Figure 8:
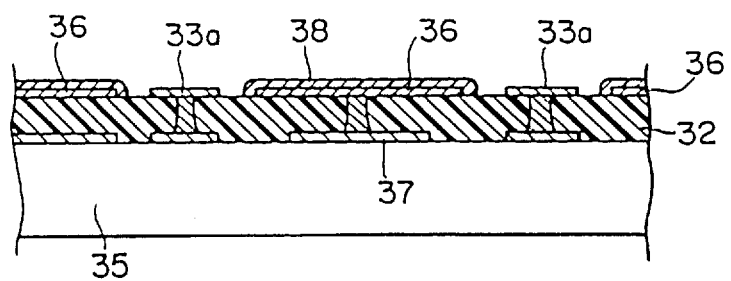
FIG. 8 is a sectional view showing essentials of still another printed wiring board according to the present invention.

FIG. 8 is a view showing essentials of a still another printed wiring board according to the present invention. In FIG. 8, the printed wiring board comprises a multilayer wiring board body 35, an insulating layer 32, a copper foil pattern 36 which serves as a shielding layer, a ground electrode 37, and an insulating layer 38 for covering the shielding layer 36. For this printed wiring board, the copper foil pattern 36 serving as the shielding layer and the ground electrode 37 are connected through the interconnection 34 formed of the conductive bump 34' penetrating through the insulating layer 32. The printed wiring board exemplified in FIG. 8 can also be manufactured according to the above mentioned process.

In the printed wiring board according to the first embodiment, the interconnections can be achieved without needs for the through-hole formation and plating processes, which otherwise was involved in the conventional one. As a result, no rejected board is generated during the manufacturing process. This significantly improves the yield and makes the resultant printed wiring board have a high reliability. The above mentioned interconnection is formed at a desired position with a high accuracy by means of penetrating by the conductive bumps through the insulating layer and using the plastic deformation associated with a manufacturing process for printed wiring boards. In addition, the interconnection ensures positive connections with a high reliability and contributes to good heat sinking and shielding properties in conjunction with the thermal and electrical conductivities. The advanced function and performance of a packaging circuit device can be obtained when the printed wiring board of the present invention is used for producing packaging circuit devices.

Second Embodiment

Figure 9A:
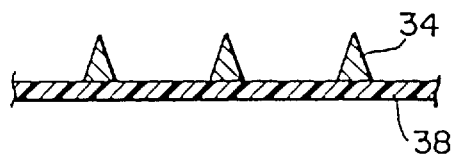
FIGS. 9A, 9B, and 9C are views for use in describing a process for manufacturing a printed wiring board according to a second embodiment of the present invention.
Figure 9B:
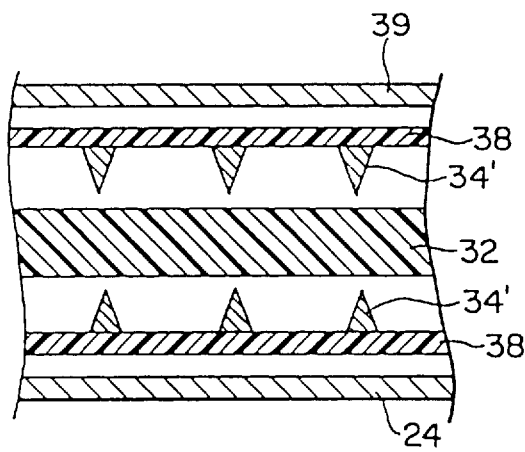
Figure 9C:
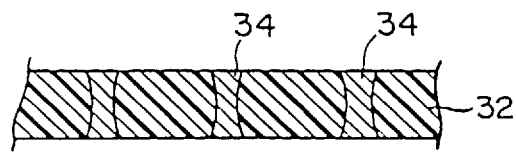

FIGS. 9A, 9B, and 9C are views for use in describing a process for manufacturing a printed wiring board according to this embodiment. A supporting sheet 38 used was a polyimide resin film of 50 μm thick (trade name Kapton Film, manufactured by Du Pont-Toray Co., Ltd.). There were also provided a silver-based conductive paste of a polymer type (trade name Thermosetting Conductive Paste DW-250 H-5, manufactured by Toyobo Company Limited) and a metal mask with a number of holes each having a diameter of 0.3–0.4 mm that are formed in a stainless steel plate of 300 μm thick at predetermined positions thereof. Then the metal mask was positioned on the polyimide resin film 38 and the conductive paste was printed thereon. The printing operation was repeated three times with the same mask. In this event, the printing was made on the same position after the printed conductive paste was dried. Conductive bumps 34' of a convex shape were thus formed at a height of from 200 to 350 μm. FIG. 9A schematically shows the configuration of the conductive bump 34' so formed, from the perspective of the side.

On the other hand, a polyetherimide resin film of 100 μm thick (trade name SUMILITE FS-1400, manufactured by Sumitomo Bakelite Co., Ltd.) was used as a synthetic resin sheet 32. As shown in section in FIG. 9B, the supporting sheet 38 on which the conductive bumps 34' are formed and the synthetic resin sheet 32 were laminated and formed as a laminate. Thereafter, the laminate was overlapped with the polyimide resin film of the same kind as the supporting sheet 38 or an aluminum foil as a caul 39. The laminate was held between hot plates of the heat press (not shown) kept at 120° C., and was pressed under a resin pressure of 1 MPa when the laminate reached to a temperature of not lower than the glass transition temperature of the resin of the synthetic resin sheet 32, preferably where it would be plastic. The laminate was then cooled. After being cooled, the laminate was picked up and the sheets 38 and 39 on both sides were removed. As a result, there was provided with the printed wiring board as shown in FIG. 9C in which the opposing conductive bumps 34' were press-fitted in the synthetic resin sheet 32 and the opposing tips of the conductive bumps 34' were plastically deformed to form the interconnections 34 penetrating through the synthetic resin sheet 32 to form the electrical connections. The interconnections 34 of a through-type were tested from both of the front and back sides by using a tester. As a result, a resistance was 0.01Ω or smaller for all interconnections.

Third Embodiment

Figure 10A:
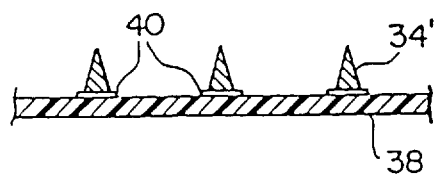
FIGS. 10A, 10B, and 10C are views for use in describing a process for manufacturing a printed wiring board according to a third embodiment of the present invention.
Figure 10B:
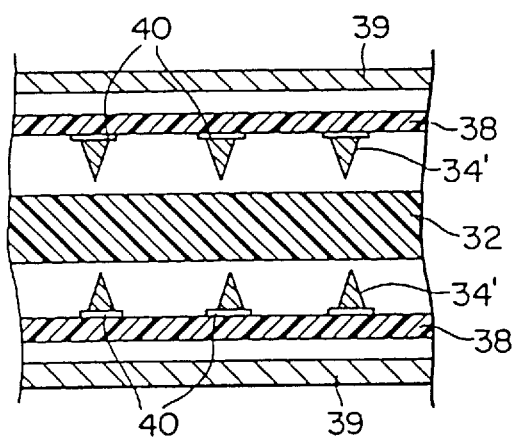
Figure 10C:
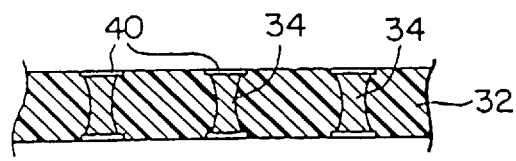

FIGS. 10A, 10B, and 10C are views for use in describing a process for manufacturing a printed wiring board according to this embodiment. A supporting sheet 38 used was a polyimide resin film of 50 μm thick (trade name Kapton Film, manufactured by Du Pont-Toray Co., Ltd.). There were also provided a silver-based conductive paste of a polymer type (trade name Thermosetting Conductive Paste DW-250 H-5, manufactured by Toyobo Company Limited) and two metal masks with a number of holes each having a diameter of 0.4 mm or 0.3 mm that are formed in stainless steel plates of 200 μm thick at predetermined positions thereof. Then the metal mask with the holes of 0.4 mm was positioned on the polyimide resin film 38 and a solder paste was printed thereon as a conductive layer for connection. Island-shaped solder layers 40 were thus selectively formed.

Next, the metal mask with the holes of 0.3 mm in diameter was positioned on the surface where the solder layers 40 were formed, and the conductive paste was printed thereon. The printing operation was repeated three times with the same mask. In this event, the printing was made on the same position after the printed conductive paste was dried. Conductive bumps 34' of a convex shape were thus formed at a height of from 200 to 350 μm. FIG. 10A schematically shows the configuration of the conductive bump 34' so formed, from the perspective of the side.

On the other hand, a polyetherimide resin film of 100 μm thick (trade name SUMILITE FS-1400, manufactured by Sumitomo Bakelite Co., Ltd.) was used as a synthetic resin sheet 32. As shown in section in FIG. 10B, the supporting sheet 38 on which the conductive bumps 34, are formed and the synthetic resin sheet 32 were laminated and formed as a laminate. Thereafter, the laminate was overlapped with the polyimide resin film of the same kind as the supporting sheet 38 or an aluminum foil as a caul 39. The laminate was held between hot plates of the heat press (not shown) kept at 120° C., and was pressed under a resin pressure of 1 MPa when the laminate reached to a temperature of not lower than the glass transition temperature of the resin of the synthetic resin sheet 32, preferably where it would be plastic. The laminate was then cooled. After being cooled, the laminate was picked up and the sheets 38 and 39 on both sides were removed. As a result, there was provided with the printed wiring board as shown in FIG. 10C in which the opposing conductive bumps 34' were press-fitted in the synthetic resin sheet 32 and the opposing tips of the conductive bumps 34' were plastic deformed. The printed wiring board has the interconnections 34 penetrating through the synthetic resin sheet 32 and the solder layers 40 at the end of the interconnections 34 which the solder layers 40 can be available for solder bonding. A similar effect was obtained when the solder layers 40 were formed by using a selective plating other than the printing method. It is noted that the solder layers 40 are not necessarily corresponding to all conductive bumps 34'. If a copper layer or the like is interposed between the solder layer 40 and the conductive bump 34' by using, for example, the plating, a subsequent soldering process may become easy.

Fourth Embodiment

Figure 11:
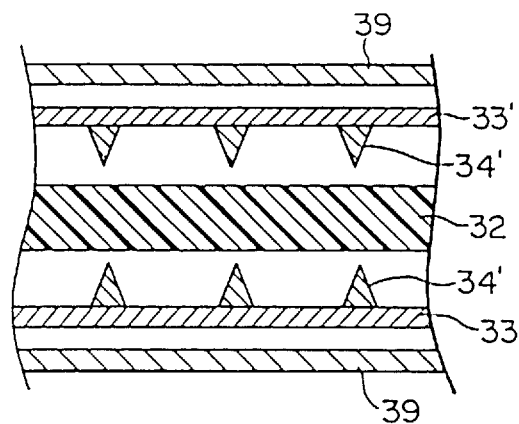
FIG. 11 is a sectional view for use in describing essential components for manufacturing the printed wiring board according to one embodiment of the present invention, in which the components are laminated at the adequate positions.
Figure 12:
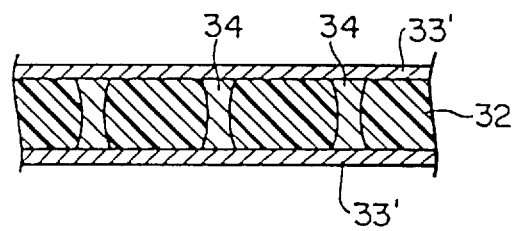
FIG. 12 is a sectional view showing conductive bumps press-fitted in a synthetic resin sheet.

FIGS. 11 through 14 are views for use in describing a process for manufacturing a printed wiring board according to this embodiment. In this embodiment, the second embodiment was repeated except that an electrolytic copper foil 33' of 35μm thick was used in place of the polyimide resin film serving as the supporting sheet 38. This electrolytic copper foil is the one typically used in manufacturing printed wiring boards. As in the second embodiment, a laminate was formed and held between hot plates of the heat press (not shown) kept at 120° C., and was pressed under a resin pressure of 1 MPa when the laminate reached to a temperature of not lower than the glass transition temperature of the resin of the synthetic resin sheet 32, preferably where it would be plastic, as shown in section in FIG. 11. The laminate was then cooled. After being cooled, the laminate was picked up and the sheet 39 on both sides were removed. As a result, there was provided with a double-sided copper-laminated plate as shown in FIG. 12 in which the opposing conductive bumps 34' were press-fitted in the synthetic resin sheet 32 and the opposing tips of the conductive bumps 34' were plastically deformed to form the interconnections 34 penetrating through the synthetic resin sheet 32. The double-sided copper-laminated plate has the conductive bumps 34' penetrating through the synthetic resin sheet 32 and the interconnections 34 connecting the copper foils 33'.

A typical etching resist ink (trade name PSR-4000 H, manufactured by TAIYO INK MFG CO., LTD.) was screen printed on both sides of the double-sided copper-laminated plate. Subsequently, the conductive patterns were masked and the plate was subjected to etching with cupric chloride used as an etching solution. The resist mask was then stripped to obtain a printed wiring board in which the patterns are electrically connected through the interconnection 34. For the double-sided printed wiring board so obtained, a typical electrical check was conducted. As a result, all connections had no trouble and no problems of reliability. A resistance value was 7 mΩ or smaller for all connections.

Figure 13:
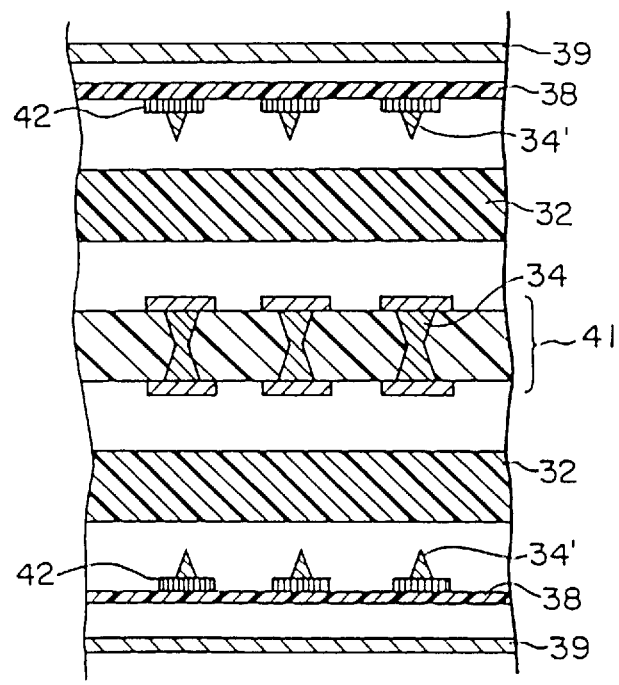
FIG. 13 is a sectional view for use in describing essential components for manufacturing the printed wiring board according to another embodiment of the present invention, in which the components are laminated at the adequate positions.
Figure 14:
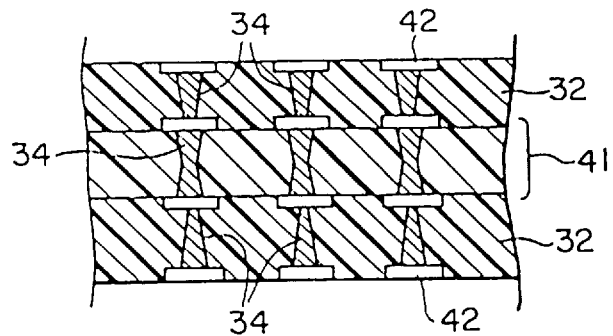
FIG. 14 is a sectional view showing essentials of still another printed wiring board according to the present invention.

In the above mentioned manufacturing process, desired wiring patterns are formed on both sides of a double-sided printed wiring board 41 as shown in section in FIG. 13. The double-sided wiring patterns are connected with each other through the conductive bumps 34 at predetermined positions. Polyimide resin films (supporting sheet) 38 and cauls 39 were laminated on both sides of the double-sided printed wiring board 41 through the synthetic resin sheets 32. In this event, the polyimide resin films 38 were provided with the conductive bumps 34' corresponding to the interconnections 34 and conductor layers 42 for connection. This laminate was heated and pressed before the polyimide resin films 38 were removed therefrom. FIG. 14 shows a multilayer printed wiring board having flat surfaces of the conductor layers 42 that were press-fitted in the synthetic resin sheets 32.

In this multilayer printed wiring board, the conductor layers 42 may be formed by means of plating copper or the like selectively or of printing a conductive paste. The conductor layers 42 advantageously avoid solder bridges upon soldering and can thus be used effectively for soldering of fine patterns.

In the manufacturing process, the conductive bumps 34' or their equivalence may be aligned at positions corresponding to outer configuration processing portions (outer configuration processing lines) of the multilayer wiring board to be manufactured. With this structure, the wiring board can be separated from the remainder by folding it along the processing line. As a result, the outer configuration processing can be simplified.

Fifth Embodiment

The second embodiment was repeated except that an electrolytic copper foil 33' of 35 μm thick, which is typically used in manufacturing printed wiring boards, was used in place of the polyimide resin film serving as the supporting sheet 38 and that a prepreg of 200 μm thick was used as the synthetic resin sheet 32 where the prepreg was obtained by means of impregnating glass cloth with an epoxy resin. The laminate-as shown in FIG. 11 was formed and pressed under the following conditions to obtain a double-sided copper-laminated plate as shown in FIG. 12 in which the copper foils 33' are connected through the interconnections 34. For the pressing process, the laminate was heated to 120° C. and a resin pressure of 2 MPa was applied thereto at that time. The laminate was further heated to 170° C. At that time, the laminate was allowed to stand for 1 hour and then cooled.

A typical etching resist ink (trade name PSR-4000 H, manufactured by TAIYO INK MFG CO., LTD.) was screen printed on both sides of the double-sided copper-laminated plate. Subsequently, the conductive patterns were masked and the plate was subjected to etching with cupric chloride used as an etching solution. The resist mask was then stripped to obtain a printed wiring board. For the double-sided printed wiring board so obtained, a typical electrical check was conducted. As a result, all connections had no trouble and no problems of reliability. To confirm the reliability of the connection between the double-sided wiring patterns, a hot oil test of 500 cycles (one cycle: 10 seconds in oil of 260° C. and 20 seconds in oil of 20° C.) revealed that no connection failure is found and the reliability of the connection between the conductive (wiring) patterns is superior to the one obtained according to a conventional copper plating process.

Sixth Embodiment

In this embodiment, an electrolytic copper foil 33' of 35μm thick was used as the supporting sheet 38 which the electrolytic copper foil is the one typically used in manufacturing printed wiring boards. A plating resist was printed on a coarse surface of the copper foil 33' to perform patterning with exposed surface areas of 0.3 mm in diameter being left at predetermined positions. Subsequently, the patterned surface areas were subjected to copper plating to laminate a copper layer of about 100 μm thick on the exposed surface areas. In addition, a nickel layer of about 10 μm thick was laminated on the copper layer to form the conductive bumps 34' of about 110 μm in total height. The fourth embodiment was then repeated except that the copper foils 33' formed by way of a plating technique were used for the conductive bumps 14. The laminate as shown in FIG. 11 was formed and pressed under the same conditions to obtain a double-sided copper-laminated plate as shown in FIG. 12 in which the copper foils 33' are connected through the interconnections 34.

A typical etching resist ink (trade name PSR-4000 H, manufactured by TAIYO INK MFG CO., LTD.) was screen printed on both sides of the double-sided copper-laminated plate. Subsequently, the conductive patterns were masked and the plate was subjected to etching with cupric chloride used as an etching solution. The resist mask was then stripped to obtain a printed wiring board. For the double-sided printed wiring board so obtained, a typical electrical check was conducted. As a result, all connections had no trouble and no problems of reliability.

Similar effects were obtained when the conductive bumps 34' were formed according to a solder dip method through a solder resist mask. In addition, the printed wiring board with the wiring patterns connected could be obtained when the formation of the conductive bumps 34' from the conductive composition in the other embodiments was conducted by using the plating technique.

Seventh Embodiment

FIGS. 15A through 15C, 16A, 16B, 17A and 17B are views for use in describing a process for manufacturing a printed wiring board according to this embodiment. A thin conductive metal plate 43 used was an electrolytic copper foil of 35 μm thick. Also used were a silver-based conductive paste of a polymer type (trade name Thermosetting Conductive Paste MS-7, manufactured by Toshiba Chemical Corporation) and a metal mask with a number of holes each having a diameter of 0.35 mm that are formed in a stainless steel plate of 300 μm thick at predetermined positions thereof. Then the metal mask was positioned on the electrolytic copper foil 43 and the conductive paste was printed thereon. The printing operation was repeated three times with the same mask. In this event, the printing was made on the same position after the printed conductive paste was dried. Conductive bumps 34' of a convex shape were thus formed at a height of from 200 to 300 μm.

Figure 15A:
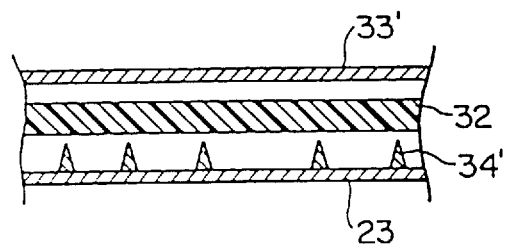
FIGS. 15A through 15C are views for use in describing a method of manufacturing the printed wiring board in order of steps according to one embodiment of the present invention.
Figure 15B:
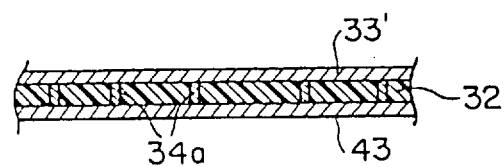

On the other hand, glass epoxy-based prepreg of 160 μm thick (synthetic resin sheet 32) and electrolytic copper foil 33' of 35 μm thick were prepared. As shown in section in FIG. 15A, the conductive-bumps 34' were opposed to the synthetic resin sheet 32 while the electrolytic copper foil 33' was positioned toward the back surface of the synthetic resin sheet 32 to form a laminate. The laminate was held between hot plates of the heat press (not shown) kept at 100° C., and was pressed under a resin pressure of 1 MPa when the synthetic resin sheet 32 became plastic by heat. The laminate was then cooled. This press formation resulted in a double-sided copper-laminated plate in which the conductive bumps 34' serve as the interconnections 34 to connect the electrolytic copper foils 43 and 33' electrically, as shown in FIG. 15B. This laminated plate has the conductive bumps 34' were press-fitted in the synthetic resin sheet 32 with their shape not being changed, and were then abutted to the electrolytic copper foil 33' causing the tips of the bumps to be deformed.

The double-sided copper-laminated plate shown in FIG. 15B can be obtained in a following manner. The synthetic resin sheet 32, an aluminum foil, and a rubber sheet are laminated at the side of forming the conductive bumps 34' on the electrolytic copper foil 43, which was then heat pressed. This heat pressing is used to make the tips of the conductive bumps 34' be penetrated through the synthetic resin sheet 32. After being cooled, the laminate is picked up and the aluminum foil and the rubber sheet are removed therefrom. Subsequently, the electrolytic copper foil 33' is laminated on the surface of the synthetic resin sheet 32 through which the tips of the conductive bumps 34' penetrate. The laminate is then interposed between hot plates of heat press kept at, for example 170° C. When the synthetic resin sheet 32 is in a plastic state, the laminate is pressed under a resin pressure of 1 MPa for about 1 hour.

Figure 15C:
Figure 16A:
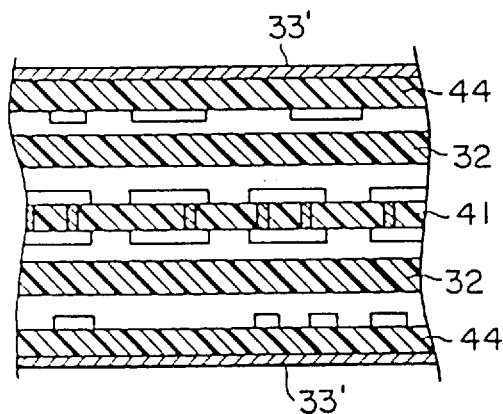
FIGS. 16A and 16B are views for use in describing a method of manufacturing the printed wiring board in order of steps according to another embodiment of the present invention.
Figure 16B:
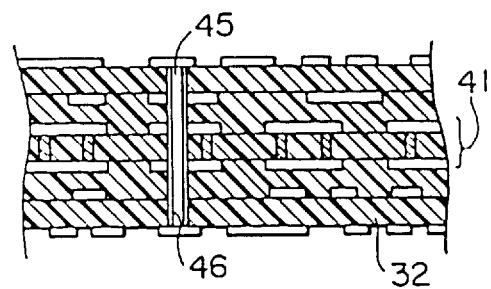
Figure 17A:
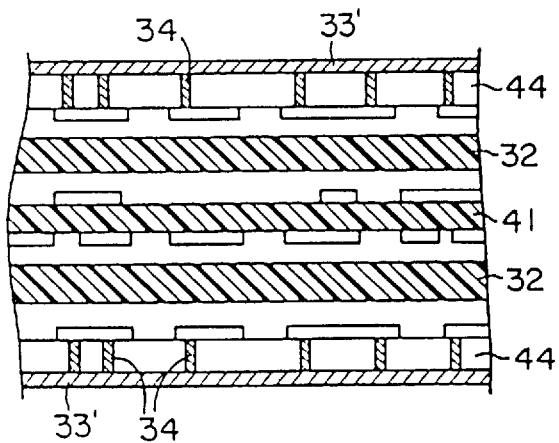
FIGS. 17A and 17B are views for use in describing a method of manufacturing the printed wiring board in order of steps according to yet another embodiment of the present invention.
Figure 17B:
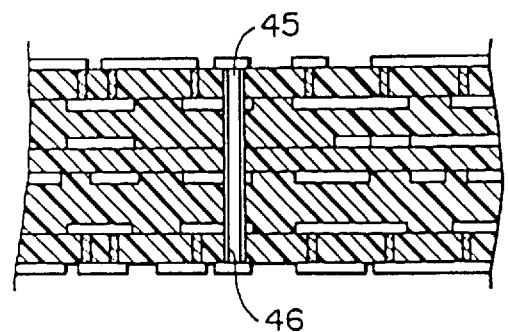

A typical etching resist ink (trade name PSR-4000 H, manufactured by TAIYO INK MFG CO., LTD.) was screen printed on the electrolytic copper foils 33' and 43 of the double-sided copper-laminated plate. Subsequently, the conductive patterns were masked and the plate was subjected to etching with cupric chloride used as an etching solution. The resist mask was then stripped to obtain a double-sided printed wiring board 41 as shown in FIG. 15C.

On the other hand, the double-sided printed wiring board 41 was provided, at both sides thereof, two copper-laminated plates 44 each being patterned at one side and a glass epoxy-based prepreg (synthetic resin sheet 32). A laminate as shown in section in FIG. 16A was then formed. The laminate was held between hot plates of the heat press (not shown) kept at 170° C., and was pressed under a resin pressure of 1 MPa when the synthetic resin sheet 32 became plastic by heat. The laminate was then cooled. Thereafter, a through-hole 45 was drilled in this multilayer laminated plate at a predetermined position. The inside of the through-hole 45 was subjected to selective chemical copper plating for about 3 hours to deposit a copper layer 46 of about 7 μm thick on the inner surface of the through-hole 45.

A typical etching resist ink (trade name PSR-4000 H, manufactured by TAIYO INK MFG CO., LTD.) was screen printed on the electrolytic copper foils 33' of the multilayer laminated plate. Subsequently, the conductive patterns were masked and the plate was subjected to etching with cupric chloride used as an etching solution. The resist mask was then stripped to obtain a multilayer printed wiring board. For the multilayer printed wiring board so obtained, a typical electrical check was conducted. As a result, all connections had no trouble and no problems of reliability. To confirm the reliability of the connection between the wiring patterns, a hot oil test of 500 cycles (one cycle: 10 seconds in oil of 260° C. and 20 seconds in oil of 20° C.) revealed that no connection failure is found and the reliability of the connection between the conductive (wiring) patterns is superior to the one obtained according to a conventional copper plating process.

Eighth Embodiment

The seventh embodiment was repeated except that a double-sided wiring board 41 was used for the two outermost wiring patterns on both sides, in which the wiring plate 41 comprises the conductive bumps 34' serving as the interconnections 34 to connect the electrolytic copper foils 33' and 43 and the wiring patterns, and that a double-sided wiring board 41' having no through-hole was used as an inner layer. A laminate as shown in section in FIG. 17A was then formed. The laminate was held between hot plates of the heat press (not shown) kept at 170° C., and was pressed under a resin pressure of 1 MPa when the synthetic resin sheet 32 became plastic by heat. The laminate was then cooled. Thereafter, a through-hole 45 was drilled in this multilayer laminated plate at a predetermined position. The inside of the through-hole 45 was subjected to selective chemical copper plating for about 3 hours to deposit a copper layer 46 of about 7 μm thick on the inner surface of the through-hole 45.

A typical etching resist ink (trade name PSR-4000 H, manufactured by TAIYO INK MFG CO., LTD.) was screen printed on the electrolytic copper foils 33' of the multilayer laminated plate. Subsequently, the conductive patterns were masked and the plate was subjected to etching with cupric chloride used as an etching solution. The resist mask was then stripped to obtain a multilayer printed wiring board. For the multilayer printed wiring board so obtained, a typical electrical check was conducted. As a result, all connections had no trouble and no problems of reliability. To confirm the reliability of the connection between the wiring patterns, a hot oil test of 500 cycles (one cycle: 10 seconds in oil of 260° C. and 20 seconds in oil of 20° C.) revealed that no connection failure is found and the reliability of the connection between the conductive (wiring) patterns is superior to the one obtained according to a conventional copper plating process.

Ninth Embodiment

As in the seventh embodiment, an electrolytic copper foil of 35 μm thick was used as a conductive metal layer 43. This electrolytic copper foil is the one typically used in manufacturing printed wiring boards. Also used were a silver-based conductive paste of a polymer type (trade name Thermosetting Conductive Paste MS-7, manufactured by Toshiba Chemical Corporation.) as conductive paste and a metal mask with a number of holes each having a diameter of 0.35 mm that are formed in a stainless steel plate of 300 μm thick at predetermined positions thereof. Then the metal mask was positioned on the electrolytic copper foil 43 and the conductive paste was printed thereon. The printing operation was repeated two times with the same mask. In this event, the printing was made on the same position after the printed conductive paste was dried. Conductive bumps 34' of a convex shape were thus formed at a height of from 200 to 300 μm.

Figure 18A:
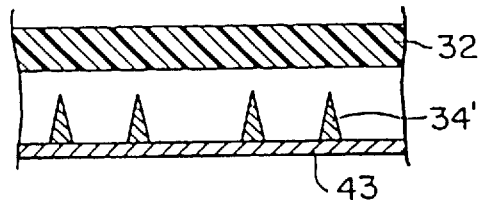
FIGS. 18A through 18D are views for use in describing a method of manufacturing the printed wiring board in order of steps according to still another embodiment of the present invention.
Figure 18B:
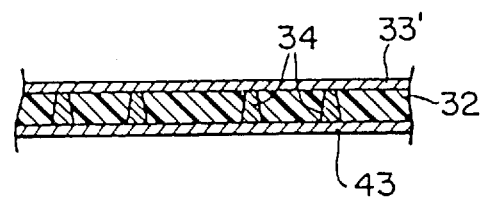

As shown in section in FIG. 18A, a synthetic resin sheet 32 of about 160 μm thick, an aluminum foil, and a rubber sheet were laminated on the electrolytic copper foil 43 where the conductive bumps 34' were printed at predetermined positions. The laminate was held between hot plates of the heat press (not shown) kept at 100° C., and was pressed under a resin pressure of 1 MPa when the laminate reached a temperature of not lower than the glass transition temperature of the resin of the synthetic resin sheet 32, preferably where it would be plastic. The laminate was then cooled. After being cooled, the aluminum foil and the rubber sheet were removed therefrom. As a result, the tips of the conductive bumps 34' were penetrated through the opposing synthetic resin sheet 32 and exposed. Subsequently, the electrolytic copper foil 33' was laminated on the surface of the synthetic resin sheet 32 from which the tips of the conductive bumps 34' were projected. The resultant laminate was pressed at 170° C. for 1 hour under 1 MPa. The tips of the conductive bumps 34' were bonded to the electrolytic copper foil 33'. The synthetic resin sheet 32 was cured and a double-sided laminated plate was thus obtained that has the interconnection 34 connecting between the double-sided electrolytic copper foils 33' and 43 (FIG. 18B).

Figure 18C:
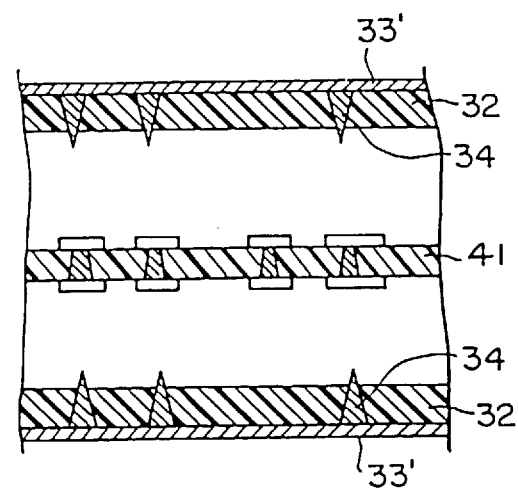

A common etching resist was laminated on both sides of the double-sided laminated plate by using a laminator. A negative film was positioned, exposed to light, and developed. Thereafter, the copper foils 33' and 43 were etched. Finally, the etching resist was stripped by using an alkali solution to form the conductive patterns and the double-sided wiring board 41 (see FIG. 18C). The interconnections 34 were tested on conductivity from both front and back sides. As a result, a resistance value was 2 mΩ or smaller for all interconnections.

Figure 18D:
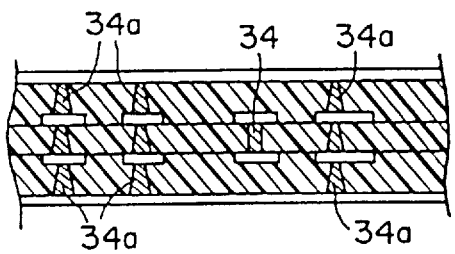

The electrolytic copper foil 43 where the conductive bumps 34' were printed, a synthetic resin sheet 32 of about 160 μm thick, an aluminum foil, and a rubber sheet were laminated at predetermined positions (not shown), which was kept at 100° C. for 7 minutes and pressed at 1 MPa for 3 minutes. Thereafter, the aluminum foil and the rubber sheet were removed therefrom. As a result, the tips of the conductive bumps 34' were penetrated through the opposing synthetic resin sheet 32 and exposed. Subsequently, this member and the double-sided wiring plate 41 were positioned and laminated as shown in section in FIG. 18C, which was kept at 170° C. for 30 minutes under a pressure of 1 MPa. The tips of the conductive bumps 34' were bonded to the wiring patterns of the double-sided wiring plate 41. A double-sided copper-laminated plate as shown in section in FIG. 18D was thus formed.

Figure 19A:
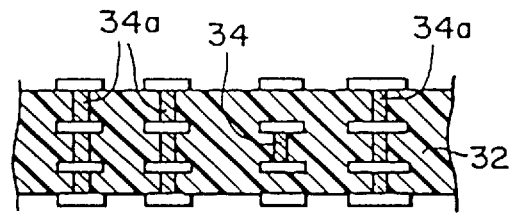
FIGS. 19A through 19D are views for use in describing a method of manufacturing the printed wiring board in order of steps according to another embodiment of the present invention.
Figure 19B:
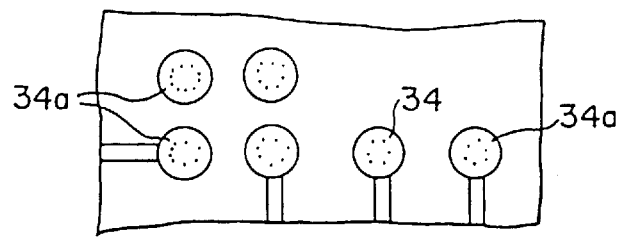

With this structure of the double-sided copper-laminated plate, a through-hole 45 may be formed around a position where a discrete part pin is to be inserted and mounted. The through-type conductive wiring portion 34a is so formed that a part of the conductive bump 34' is exposed to the inner wall of the through-hole 45. In other words, the through-type conductive wiring portion 34a (see FIG. 18D) is particularly provided at a position where the through-hole 45 is to be formed for receiving the part pin, as shown in plane in FIG. 19B.

Figure 19C:
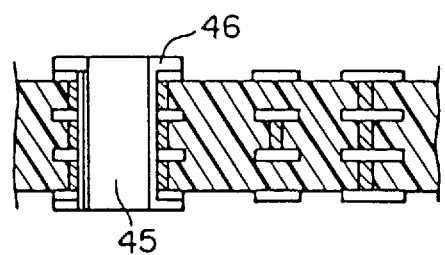
Figure 19D:
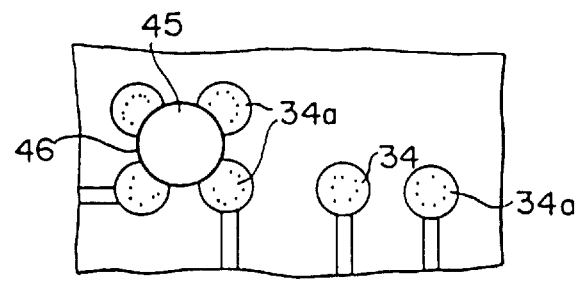

Next, the through-hole 45 for use in receiving the discrete part pin was drilled at a generally central position of the through-type conductive wiring portion 34a on the double-sided copper-laminated plate. Subsequently, the inner surface of the through-hole 45 was subjected to chemical copper plating for 3 hours to separate a copper layer 46 of about 7 µm thick. A common etching resist was laminated on the double-sided copper foils 33' and 43 of the double-sided laminated plate by using a laminator. A negative film was positioned for etching as in the above mentioned case. The copper foils 33' and 43 were thus patterned as shown in section in FIG. 19A. In addition, as shown in section and in plane in FIGS. 19C and 19D, respectively, a four-layer thin multilayer printed wiring board of about 550 µm thick was formed that comprises a through-hole 45 for part mounting formed of a good copper layer 46 connected to the through-type conductive wiring portion 34a and pads.

A pin of a discrete part was inserted into the through-hole 45 of the four-layer thin multilayer printed wiring board and soldered to provide a package circuit device. With this device, a connection mounting of the discrete part was achieved with a high reliability.

Tenth Embodiment

The ninth embodiment was repeated to form a four-layer thin multilayer printed wiring board except that the copper paste was used in place of forming the conductive bumps from the silver paste. In this embodiment, a conductor including copper was exposed to the inner wall of the through-hole 45 when the through-hole 45 was formed for the discrete part pin at the center of the through-type conductive wiring portion 34a. Accordingly, there was no fear of solder damage and the discrete part pin could thus be inserted for soldering.

The chemical copper plating to the inner wall of the through-hole is essential for multilayer wiring boards when a discrete part is mounted. On the contrary, no chemical copper plating for soldering is required for the structure of the present invention. In addition, the present invention ensures reliability of the electrical connections between the surface wiring patterns and the inner wiring patterns by using a plurality of through-type conductive wiring portions 34a. Accordingly, a method of manufacturing a multilayer wiring board can be established with only dry processes.

For the inventions described in conjunction with the second through tenth embodiments, it is possible to simplify the steps of forming the conductive bumps for connecting the wiring patterns, of pressing with heat the synthetic resin sheet laminated, and of patterning the outer layer. In other words, it becomes possible to manufacture in a simple manner a double-sided printed wiring board and a multilayer printed wiring board while reducing significantly the number of steps as compared with the conventional manufacturing process. This is particularly true in manufacturing the multilayer printed wiring board with many iterative steps, improving the productivity. In addition, there is no need for the steps of forming through-holes and plating for ensuring the electrical connections between the wiring patterns, which are inevitable for the conventional method of manufacturing the multilayer printed wiring board. As a result, the number of the rejected boards can be reduced significantly while improving the yield. In addition, the resultant printed wiring board is highly reliable. Further, the wiring density can be improved significantly because no opening is present on the surface of the printed wiring board. Likewise, the area for the electronic components can be determined without considering the position of the holes. As a result, the packaging density can also be improved with a distance between the electronic components being reduced, which in turn improves the performance of the circuit. In this way, the present invention provides a cost-saving, simplification of the printed wiring board with an improved performance.

While the present invention has thus been described in conjunction with specific preferred embodiments, it can be understood that the present invention is not limited to those embodiments and various changes and modifications can be made by those skilled in the art without departing the scope of the appended claims.

What is claimed is:

1. A method of manufacturing a printed wiring board comprising the steps of:

forming conductive bumps on supports at predetermined positions thereof, said conductive bumps facing each other;

interposing a synthetic resin sheet between the surfaces of the supports on which the conductive bumps are formed;

laminating the supports and the synthetic resin sheet as a laminate;

heating the laminate; and pressing the laminate at a glass transition temperature through a plasticizing temperature or a curing temperature of the resin component of the synthetic resin sheet to make the conductive bumps be inserted into the synthetic resin sheet in a direction of a sheet thickness, thereby connecting the tips of the corresponding conductive bumps with each other by using plastic deformation to form interconnections of a through-type.

2. A method of manufacturing a printed wiring board as claimed in claim 1, wherein the insulating resin sheet is made of a thermoplastic resin.

3. A method of manufacturing a printed wiring board as claimed in claim 1, wherein the insulating resin sheet is made of a fiber-reinforced thermoplastic resin.

4. A method of manufacturing a printed wiring board as claimed in claim 1, wherein the insulating resin sheet is made of a thermosetting resin.

5. A method of manufacturing a printed wiring board as claimed in claim 1, wherein the insulating resin sheet is made of a fiber-reinforced thermosetting resin.

6. A method of manufacturing a printed wiring board comprising the steps of:

forming conductive bumps on conductive supports at predetermined positions thereof;

interposing a synthetic resin sheet between the surfaces of the conductive supports on which the conductive bumps are formed;

laminating the conductive supports and the synthetic resin sheet as a first laminate;

heating the first laminate;

pressing the first laminate at a glass transition temperature through a plasticizing temperature or a curing temperature of the resin component of the synthetic resin sheet to make the conductive bumps be inserted into the synthetic resin sheet in a direction of a sheet thickness, thereby connecting the tips of the corresponding conductive bumps with each other by using plastic deformation to form interconnections of a through-type;

wire patterning the conductive supports;

facing to the wire patterned surface another conductive support surface on which the conductive bumps are formed through another synthetic resin sheet to obtain a second laminate;

heating the second laminate; and pressing the second laminate at a glass transition temperature through a plasticizing temperature or a curing temperature of the resin component of the other synthetic resin sheet to make the conductive bumps be inserted into that synthetic resin sheet in a direction of a sheet thickness, thereby connecting the tips of the corresponding conductive bumps with each other by using plastic deformation to form interconnections of a through-type.

7. A method of manufacturing a printed wiring board as claimed in claim 6, wherein the insulating resin sheet is made of a thermoplastic resin.

8. A method of manufacturing a printed wiring board as claimed in claim 6, wherein the insulating resin sheet is made of a fiber-reinforced thermoplastic resin.

9. A method of manufacturing a printed wiring board as claimed in claim 6, wherein the insulating resin sheet is made of a thermosetting resin.

10. A method of manufacturing a printed wiring board as claimed in claim 6, wherein the insulating resin sheet is made of a fiber-reinforced thermosetting resin.

11. A method of manufacturing a printed wiring board comprising the steps of:

forming conductive bumps on supports at least at a part of predetermined positions, the supports being provided with a conductor layer as a base layer;

interposing a synthetic resin sheet between the surfaces of the supports on which the conductive bumps are formed;

laminating the supports and the synthetic resin sheet as a laminate;

heating the laminate; and pressing the laminate at a glass transition temperature through a plasticizing temperature or a curing temperature of the resin component of the synthetic resin sheet to make the conductive bumps be inserted into the synthetic resin sheet in a direction of a sheet thickness, thereby connecting the tips of the corresponding conductive bumps with each other by using plastic deformation to form interconnections of a through-type.

12. A method of manufacturing a printed wiring board as claimed in claim 11, wherein the insulating resin sheet is made of a thermoplastic resin.

13. A method of manufacturing a printed wiring board as claimed in claim 11, wherein the insulating resin sheet is made of a fiber-reinforced thermoplastic resin.

14. A method of manufacturing a printed wiring board as claimed in claim 11, wherein the insulating resin sheet is made of a thermosetting resin.

15. A method of manufacturing a printed wiring board as claimed in claim 11, wherein the insulating resin sheet is made of a fiber-reinforced thermosetting resin.

16. A method of manufacturing a printed wiring board comprising the steps of:

forming conductive bumps on conductive metal foils at predetermined positions thereof;

interposing a synthetic resin sheet between the surfaces of the conductive metal foils on which the conductive bumps are formed;

laminating the conductive metal foils and the synthetic resin sheet as a laminate;

heating the laminate;

pressing the laminate at a glass transition temperature through a plasticizing temperature or a curing temperature of the resin component of the synthetic resin sheet to make the conductive bumps be inserted into the synthetic resin sheet in a direction of a sheet thickness, thereby connecting the tips of the corresponding-conductive bumps with each other by using plastic deformation to form interconnections of a through-type; and etching the conductive metal foils of the laminate having the interconnections of the through-type formed to form wiring patterns to be connected with the interconnections of the through-type.

17. A method of manufacturing a printed wiring board as claimed in claim 16, wherein the insulating resin sheet is made of a thermoplastic resin.

18. A method of manufacturing a printed wiring board as claimed in claim 16, wherein the insulating resin sheet is made of a fiber-reinforced thermoplastic resin.

19. A method of manufacturing a printed wiring board as claimed in claim 16, wherein the insulating resin sheet is made of a thermosetting resin.

20. A method of manufacturing a printed wiring board as claimed in claim 16, wherein the insulating resin sheet is made of a fiber-reinforced thermosetting resin.

21. A method of manufacturing a printed wiring board comprising the steps of:

forming conductive bumps on a principal surface of a conductive metal layer at predetermined positions thereof;

facing a principal surface of a synthetic resin sheet to the principal surface of the conductive metal layer to form a laminate comprising a number of layers including an inner layer wiring pattern;

heating the laminate;

pressing the laminate at a glass transition temperature through a plasticizing temperature or a curing temperature of the resin component of the synthetic resin sheet to make the conductive bumps be inserted into the synthetic resin sheet in a direction of a sheet thickness, thereby connecting the conductive bumps with the inner wiring pattern on the synthetic resin sheet to form a multilayer wiring board;

forming a through-hole for use in receiving a lead pin penetrated through the multilayer wiring board at a predetermined position; and disposing a metal layer on the inner surface of the through-hole by using a plating process.

22. A method of manufacturing a printed wiring board as claimed in claim 21, wherein the insulating resin sheet is made of a thermoplastic resin.

23. A method of manufacturing a printed wiring board as claimed in claim 21, wherein the insulating resin sheet is made of a fiber-reinforced thermoplastic resin.

24. A method of manufacturing a printed wiring board as claimed in claim 21, wherein the insulating resin sheet is made of a thermosetting resin.

25. A method of manufacturing a printed wiring board as claimed in claim 21, wherein the insulating resin sheet is made of a fiber-reinforced thermosetting resin.

26. A method of manufacturing a printed wiring board comprising the steps of:

forming conductive bumps on a principal surface of a conductive metal layer such that a position is included in an area where a through-hole for use in receiving a lead pin is expected to be formed, a part of the position being allowed to be exposed at a number of positions on the inner surface of the expected through-hole;

facing a principal surface of a synthetic resin sheet to the principal surface of the conductive metal layer to form a laminate comprising a number of layers including an inner layer wiring pattern;

heating the laminate;

pressing the laminate at a glass transition temperature through a plasticizing temperature or a curing temperature of the resin component of the synthetic resin sheet to make the conductive bumps be inserted into the synthetic resin sheet in a direction of a sheet thickness, thereby connecting the conductive bumps with the inner wiring pattern on the synthetic resin sheet to form a multilayer wiring board;

forming the through-hole for use in receiving the lead pin penetrated through the multilayer wiring board at a predetermined position so that a part of each conductive bump is exposed in the inner surfaces; and disposing a metal layer on the inner surface of the through-hole by using a plating process.

\* \* \* \* \*

UNITED STATES PATENT AND TRADEMARK OFFICE
CERTIFICATE OF CORRECTION

PATENT NO.: 5,865,934

DATED: February 2, 1999

INVENTOR(S): Yuichi Yamamoto et al.

It is certified that an error appears in the above-identified patent and that said Letters Patent is hereby corrected as shown below:

Title page, Item [57] in the Abstract, line 15, change "grass" to --glass--.

Signed and Sealed this

Seventeenth Day of August, 1999

Attest:

Q. TODD DICKINSON

Attesting Officer

Acting Commissioner of Patents and Trademarks